US009484866B2

(12) United States Patent
Sun et al.

(10) Patent No.: US 9,484,866 B2
(45) Date of Patent: Nov. 1, 2016

(54) DOHERTY POWER AMPLIFYING CIRCUIT AND POWER AMPLIFIER

(71) Applicant: Huawei Technologies Co., Ltd., Shenzhen (CN)

(72) Inventors: Jie Sun, Shanghai (CN); Zhixiong Zeng, Shanghai (CN); Xuekun Li, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/859,080

(22) Filed: Sep. 18, 2015

(65) Prior Publication Data

US 2016/0013762 A1 Jan. 14, 2016

Related U.S. Application Data

(63) Continuation of application No. PCT/CN2014/073743, filed on Mar. 20, 2014.

(30) Foreign Application Priority Data

Mar. 20, 2013 (CN) .......................... 2013 1 0089529

(51) Int. Cl.
*H03F 3/68* (2006.01)
*H03F 1/02* (2006.01)
*H03F 1/56* (2006.01)
(Continued)

(52) U.S. Cl.
CPC .............. *H03F 1/0288* (2013.01); *H03F 1/56* (2013.01); *H03F 3/19* (2013.01); *H03F 3/195* (2013.01); *H03F 3/211* (2013.01); *H03F 3/245* (2013.01); *H03F 2200/222* (2013.01);
(Continued)

(58) Field of Classification Search
CPC ........ H03F 5/00; H03F 3/45475; H03F 3/44; H03F 3/28; H03F 3/602; H03F 7/02; H03F 3/45085; H03F 3/26; H03F 1/14; H03F 3/21; H03F 2200/372; H03F 3/68; H03G 1/0023; H03G 1/00
USPC ............ 330/3, 69, 74, 116, 117, 124 R, 134, 330/252, 254, 262, 275, 284, 292, 295, 301, 330/307; 375/296, 297; 455/114.3
See application file for complete search history.

(56) References Cited

U.S. PATENT DOCUMENTS

2006/0044060 A1  3/2006  Shiikuma
2008/0036533 A1  2/2008  Lim
(Continued)

FOREIGN PATENT DOCUMENTS

CN  1741373 A  3/2006
CN  101534093 A  9/2009
(Continued)

*Primary Examiner* — Steven J Mottola
*Assistant Examiner* — Hafizur Rahman
(74) *Attorney, Agent, or Firm* — Slater Matsil, LLP

(57) ABSTRACT

A Doherty power amplifying circuit includes at least two asymmetrical two-branch power devices. Each of the asymmetrical two-branch power devices includes two power amplifiers. In the at least two asymmetrical two-branch power devices, one power amplifier included in each asymmetrical two-branch power device separately forms a peak power amplifier of the Doherty power amplifying circuit, and the other power amplifiers included in all the asymmetrical two-branch power devices jointly form a main power amplifier of the Doherty power amplifying circuit.

10 Claims, 2 Drawing Sheets

(51) Int. Cl.
   *H03F 3/195* (2006.01)
   *H03F 3/24* (2006.01)
   *H03F 3/19* (2006.01)
   *H03F 3/21* (2006.01)

(52) U.S. Cl.
   CPC .. *H03F 2200/387* (2013.01); *H03F 2200/451* (2013.01); *H03F 2203/21106* (2013.01)

(56) References Cited

U.S. PATENT DOCUMENTS

| | | |
|---|---|---|
| 2011/0080215 A1 | 4/2011 | Meng |
| 2012/0025915 A1 | 2/2012 | Ui |
| 2013/0120061 A1* | 5/2013 | van der Zanden ... H03F 1/0288 330/124 R |

2014/0306765 A1   10/2014   Zhang et al.

FOREIGN PATENT DOCUMENTS

| | | | | |
|---|---|---|---|---|
| CN | 102355198 A | 2/2012 | | |
| CN | 102427332 A | 4/2012 | | |
| CN | 102545788 A | 7/2012 | | |
| CN | WO 2013086658 A1 * | 6/2013 | ........... | H03F 1/0288 |
| CN | 103199798 A | 7/2013 | | |
| EP | 2490329 A1 | 8/2012 | | |
| EP | 2521257 A1 | 11/2012 | | |
| EP | 2775609 A1 | 9/2014 | | |
| KR | 1020110111937 A | 10/2011 | | |
| WO | 9816997 A1 | 4/1998 | | |
| WO | 2008053534 A1 | 5/2008 | | |

\* cited by examiner

DOHERTY POWER AMPLIFYING CIRCUIT AND POWER AMPLIFIER

This application is a continuation of International Application No. PCT/CN2014/073743, filed on Mar. 20, 2014, which claims priority to Chinese Patent Application No. 201310089529.0, filed on Mar. 20, 2013, both of which are hereby incorporated by reference in their entireties.

TECHNICAL FIELD

The present application relates to a power amplifier, and in particular, to a Doherty power amplifying circuit and a power amplifier.

BACKGROUND

A power amplifier is an indispensable part of a wireless base station, and efficiency of the power amplifier determines power consumption, a size, thermal design, and the like of the base station. Currently, in order to improve utilization efficiency of a frequency spectrum, modulation signals of different standards are used in wireless communications, such as orthogonal frequency division multiplexing (OFDM), Code Division Multiple Access (CDMA), and Time Division Multiple Access (TDMA) signals. According to specifications in related protocols, signals of these standards have different peak-to-average power ratios, for example, a peak-to-average power ratio of the OFDM is 10 to 12 dB. Signals with high peak-to-average ratios have higher requirements for a power amplifier in a base station.

In order to enable the power amplifier in the base station to undistortedly amplify these signals with high peak-to-average ratios, one method is a power back-off method, that is, the power amplifier works in a class-A or class-AB state; however, according to a feature of the power amplifier, the method causes a sharp decline in efficiency of the power amplifier, and in the case of a same output power, energy consumption of the base station is greatly increased. Another method is to combine a high-efficiency non-linear power amplifier with a linear digital technology such as digital predistortion (DPD). In this way, better efficiency of the power amplifier can be achieved, and linearity of the power amplifier can also meet a requirement in a related protocol. Currently, a Doherty technology is a high-efficiency mainstream power amplifier technology because of simple implementation and a low cost.

A conventional symmetrical Doherty power amplifying circuit achieves optimum efficiency at 6 dB back-off. In fact, a high peak-to-average power ratio as a trend becomes increasingly apparent in current and future communications systems, and in order to achieve higher efficiency in the case of signals with a higher peak-to-average power ratio, asymmetrical and multi-way Doherty technologies are applied more and more widely. For example, a typical 3-branch Doherty power amplifying circuit in the prior art generally has 3 power devices: 1 main power amplifier and 2 peak power amplifiers, where each of them is a separately encapsulated device.

However, problems exist in this power amplifying circuit. The main power amplifier accounts for most of the power consumption of the entire power amplifying circuit, and most of heat consumption is concentrated on one power device, namely the main power amplifier. This brings about some problems. First, heat concentration is adverse to heat dissipation of a system; and second, large heat consumption of the main power amplifier leads to deterioration in performance of the main power amplifier at a high temperature, and an excessively high junction temperature of a die of a chip reduces reliability of the main power amplifier.

Further, a conventional 3-branch Doherty power amplifying circuit uses three devices. A larger number of devices and a larger area of a module lead to an increase in costs of the entire module.

SUMMARY

Embodiments of the present application provide a Doherty power amplifying circuit and a power amplifier, so as to improve heat dissipation of a main power amplifier, reduce the number of devices of a circuit, reduce an area of the circuit, and reduce costs.

According to a first aspect, the present application provides a Doherty power amplifying circuit. The Doherty power amplifying circuit includes at least two asymmetrical two-branch power devices, and each of the at least two asymmetrical two-branch power devices includes two power amplifiers. In the at least two asymmetrical two-branch power devices, one power amplifier included in each asymmetrical two-branch power device separately forms a peak power amplifier of the Doherty power amplifying circuit, and the other power amplifiers included in all the asymmetrical two-branch power devices jointly form a main power amplifier of the Doherty power amplifying circuit.

In a first possible implementation manner, the Doherty power amplifying circuit includes N−1 asymmetrical two-branch power devices, where N is a positive integer greater than 2. The N−1 asymmetrical two-branch power devices form an N-way Doherty power amplifying circuit.

With reference to the first possible implementation manner of the first aspect, in a second possible implementation manner, in the N−1 asymmetrical two-branch power devices, power amplifiers included in all the asymmetrical two-branch power devices and configured to jointly form a main power amplifier of the N-way Doherty power amplifying circuit have an equal first maximum output power. In the N−1 asymmetrical two-branch power devices, a power amplifier comprised in each asymmetrical two-branch power device and configured to separately form a peak power amplifier of the N-way Doherty power amplifying circuit has an equal second maximum output power. The second maximum output power=(N−1)*M*the first maximum output power, where M is a positive number.

With reference to the second possible implementation manner of the first aspect, in a third possible implementation manner, a value of M increases with a peak-to-average power ratio of a communications system signal.

With reference to the first aspect, the first possible implementation manner of the first aspect, the second possible implementation manner of the first aspect, or the third possible implementation manner of the first aspect, in a fourth possible implementation manner, each of the at least two asymmetrical two-branch power devices is formed by integrating the two power amplifiers included in each asymmetrical two-branch power device.

With reference to the first aspect, the first possible implementation manner of the first aspect, the second possible implementation manner of the first aspect, the third possible implementation manner of the first aspect, or the fourth possible implementation manner of the first aspect, in a fifth possible implementation manner, in the at least two asymmetrical two-branch power devices, the two power amplifiers included in each asymmetrical two-branch power device separately have a corresponding impedance matching circuit, and the impedance matching circuit includes an input matching circuit and an output matching circuit.

With reference to the fifth possible implementation manner of the first aspect, in a sixth possible implementation manner, the two power amplifiers included in each of the at least two asymmetrical two-branch power devices are separately connected to a combiner by using their respective output matching circuits.

With reference to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, or the sixth possible implementation manner of the first aspect, in a seventh possible implementation manner. In the at least two asymmetrical two-branch power devices, a gate bias voltage of any power amplifier configured to separately form the peak power amplifier of the Doherty power amplifying circuit is lower than a gate bias voltage of any of the power amplifiers configured to jointly form the main power amplifier of the Doherty power amplifying circuit.

With reference to the seventh possible implementation manner of the first aspect, in an eighth possible implementation manner, the peak power amplifiers of the Doherty power amplifying circuit are turned on sequentially in descending order of gate bias voltage.

According to a second aspect, the present application provides a power amplifier, including the Doherty power amplifying circuit according to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, the sixth possible implementation manner of the first aspect, the seventh possible implementation manner of the first aspect, or the eighth possible implementation manner of the first aspect.

It can be known from above that, in some feasible implementation manners of the present application, integration of a power amplifier into an asymmetrical two-branch power device reduces the number of devices of a circuit, an area of the circuit, and costs; and heat consumption of a main power amplifier is dispersed to each asymmetrical two-branch power device, which helps improve heat dissipation of the main power amplifier.

BRIEF DESCRIPTION OF THE DRAWINGS

To describe the technical solutions in the embodiments of the present application or in the prior art more clearly, the following briefly introduces the accompanying drawings required for describing the embodiments. Apparently, the accompanying drawings in the following description show merely some embodiments of the present application, and a person of ordinary skill in the art may still derive other drawings from these accompanying drawings without creative efforts.

DETAILED DESCRIPTION OF ILLUSTRATIVE EMBODIMENTS

Figure 1:
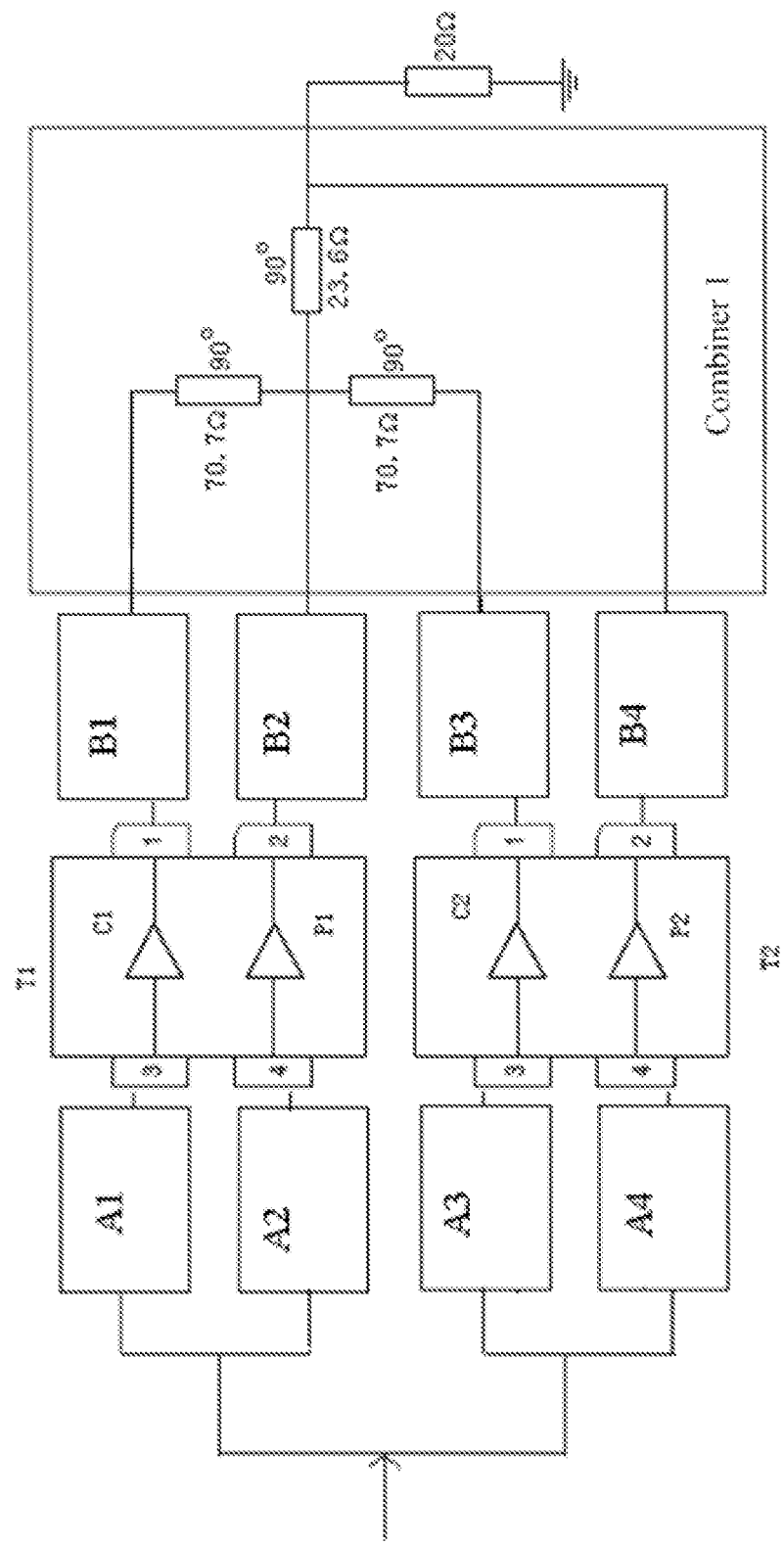
FIG. 1 is a schematic diagram of a circuit structure of a 3-branch Doherty power amplifying circuit.

The following clearly describes the technical solutions in the embodiments of the present application with reference to the accompanying drawings in the embodiments of the present application. Apparently, the described embodiments are merely a part of the embodiments of the present application rather than all of the embodiments. All other embodiments obtained by a person of ordinary skill in the art based on the embodiments of the present application without creative efforts shall fall within the protection scope of the present application.

In order to solve problems that exist in a Doherty power amplifying circuit in the prior art, such as concentration of heat consumption, a large number of devices, and high costs, an embodiment of the present application provides a Doherty power amplifying circuit, where the Doherty power amplifying circuit includes at least two asymmetrical two-branch power devices, and each of the at least two asymmetrical two-branch power devices includes two power amplifiers; and in the at least two asymmetrical two-branch power devices, one power amplifier included in each asymmetrical two-branch power device separately forms a peak power amplifier of the Doherty power amplifying circuit, and the other power amplifiers included in all the asymmetrical two-branch power devices jointly form a main power amplifier of the Doherty power amplifying circuit.

As an implementation manner, the Doherty power amplifying circuit includes N−1 asymmetrical two-branch power devices, where N is a positive integer greater than 2. The N−1 asymmetrical two-branch power devices form an N-way Doherty power amplifying circuit.

In the N−1 asymmetrical two-branch power devices, power amplifiers included in all the asymmetrical two-branch power devices and configured to jointly form a main power amplifier of the N-way Doherty power amplifying circuit have an equal first maximum output power; and a power amplifier included in each asymmetrical two-branch power device and configured to separately form a peak power amplifier of the N-way Doherty power amplifying circuit has an equal power amplifying circuit. The second maximum output power=(N−1)*M*the first maximum output power, where M is a positive number. A value of M increases with a peak-to-average power ratio of a communications system signal.

Each of the at least two asymmetrical two-branch power devices is formed by integrating the two power amplifiers included in each asymmetrical two-branch power device.

In the at least two asymmetrical two-branch power devices, the two power amplifiers included in each asymmetrical two-branch power device separately have a corresponding impedance matching circuit, and the impedance matching circuit includes an input matching circuit and an output matching circuit. The two power amplifiers included in each of the at least two asymmetrical two-branch power devices are separately connected to a combiner by using their respective output matching circuits.

In the at least two asymmetrical two-branch power devices, a gate bias voltage of any power amplifier configured to separately form the peak power amplifier of the Doherty power amplifying circuit is lower than a gate bias voltage of any of the power amplifiers configured to jointly form the main power amplifier of the Doherty power amplifying circuit. The peak power amplifiers of the Doherty power amplifying circuit are turned on sequentially in descending order of gate bias voltage. According to the Doherty power amplifying circuit provided by the embodiment of the present application, integration of a power amplifier into an asymmetrical two-branch power device reduces the number of devices of a circuit, an area of the circuit, and costs; and heat consumption of a main power amplifier is dispersed to each asymmetrical two-branch power device, which helps improve heat dissipation of the main power amplifier.

The following uses a 3-branch Doherty power amplifying circuit as an example for description.

FIG. 1 is a schematic diagram of a circuit structure of a 3-branch Doherty power amplifying circuit. FIG. 1 shows a 3-branch Doherty power amplifying circuit with a power distribution ratio of 1:1:1. T1 and T2 are 2 asymmetrical two-branch power devices, and each of the asymmetrical two-branch power devices has two branches of power amplifiers internally. Two branches of power amplifiers in the T1 device are C1 and P1, and two branches of power amplifiers in the T2 device are C2 and P2, where C1 is integrated with P1 and C2 is integrated with P2, so as to form T1 and T2 respectively.

Maximum output powers of C1 and P1 are different and those of C2 and P2 are different. The maximum output powers of C1, P1, C2 and P2 are selected according to a design of the 3-branch Doherty power amplifying circuit, and a relationship between the maximum output powers of C1, P1, C2 and P2 is as follows:

the maximum output power of C1=the maximum output power of C2;

the maximum output power of P1=the maximum output power of P2=2*the maximum output power of C1; and it is set that a gate bias voltage of P1 is lower than gate bias voltages of C1 and C2, and a gate bias voltage of P2 is lower than the gate bias voltage of P1.

In a circuit design for a radio frequency power amplifier, an input and an output of the power amplifier require a matching circuit to match a proper impedance point, so as to ensure the power, efficiency, a gain, and the like of the power amplifier. Input ends and output ends of C1, P1, C2 and P2 are separately connected to an input matching circuit and an output matching circuit. C1 is separately connected to an input matching circuit A1 and an output matching circuit B1, P1 is separately connected to an input matching circuit A2 and an output matching circuit B2, C2 is separately connected to an input matching circuit A3 and an output matching circuit B3, and P2 is separately connected to an input matching circuit A4 and an output matching circuit B4.

The output matching circuits of C1, P1, C2 and P2 are connected to a combiner 1, and the combiner 1 combines output powers of C1, P1, C2 and P2 together, and outputs a combined output power to a load; the combiner 1 further includes an impedance transformation part of the 3-branch Doherty power amplifying circuit, and a proper impedance transformation relationship is selected according to the relationship between the maximum output powers of C1, C2, P1 and P2, where selecting the impedance transformation relationship is to make impedance traction between C1, P1, C2 and P2 meet a qualification of a Doherty design.

A working principle of the 3-branch Doherty power amplifying circuit shown in FIG. 1 is as follows.

In actual working, C1 and C2 are combined to serve as a main power amplifier, and P1 and P2 serve as a first peak power amplifier and a second peak power amplifier respectively.

When an output power back-off is less than 12 dB, the main power amplifier including C1 and C2 works mainly; and P1 and P2 work in a C class and are not turned on.

When the output power back-off is less than 12 dB and greater than 6 dB, P1 is turned on, the main power amplifier including C1 and C2, and P1 work, and P2 is not turned on.

When the output power back-off is less than 6 dB, P2 is also turned on, and C1, C2, P1, and P2 all work.

The combiner 1 combines the output powers of C1, P1, C2 and P2 together, and outputs the combined output power to the load.

Because the gate bias voltage of P1 is lower than the gate bias voltages of C1 and C2 and the gate bias voltage of P2 is lower than the gate bias voltage of P1, the main power amplifier and the peak power amplifiers are turned on sequentially. Specifically, a higher gate bias voltage indicates a higher gain, and a gain of the peak power amplifiers increases with an input power; therefore, for a same input power, when the input power is very small, an output power of the main power amplifier is far greater than the output power of P1, and the output power of P1 is greater than the output power of P2.

At this time, the main power amplifier is working mainly, that is, the output power is mainly output by the main power amplifier. When the input power continues increasing until the output power equals a total power from which 12 dB is backed off, a gain of P1 becomes greater, and the output power of P1 starts to increase; however, at this time, a gain of P2 is still low, and the output power of P2 can be omitted. When the input power continues increasing until the output power equals a total power from which 6 dB is backed off, the gain of P2 becomes greater, and the output power of P2 starts to increase. Finally, the output powers of the main power amplifier and the peak power amplifiers reach the maximum output powers of the main power amplifier and the peak power amplifiers.

According to the 3-branch Doherty power amplifying circuit provided by the foregoing embodiment, C1 and C2 are combined and serve as the main power amplifier; in this way, heat consumption of the main power amplifier is dispersed to the two asymmetrical two-branch power devices T1 and T2, thereby improving heat dissipation of a module and performance of a device; and C1, C2, P1, and P2 are integrated into the two asymmetrical two-branch power devices T1 and T2, thereby reducing the number of devices, an area of a circuit, and costs.

Figure 2:
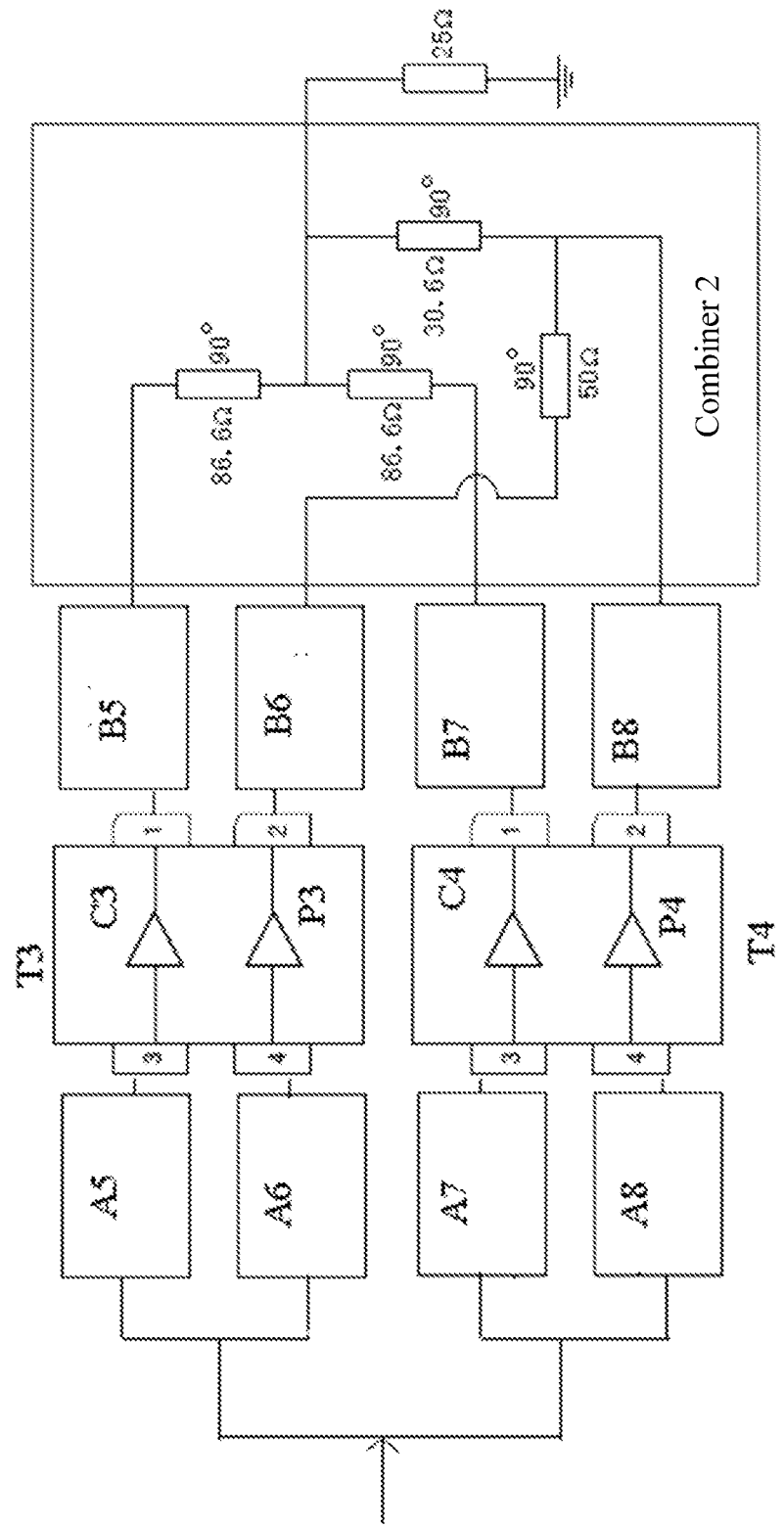
FIG. 2 is a schematic diagram of a circuit structure of another 3-branch Doherty power amplifying circuit.

FIG. 2 is a schematic diagram of a circuit structure of another 3-branch Doherty power amplifying circuit. FIG. 2 shows a 3-branch Doherty power amplifying circuit with a power distribution ratio of 1:2:2. A maximum output power relationship of the 3-branch Doherty power amplifying circuit with a power distribution ratio of 1:2:2 is as follows:

a maximum output power of C1=a maximum output power of C2; and a maximum output power of P1=a maximum output power of P2=4*the maximum output power of C1.

A difference between FIG. 2 and FIG. 1 lies in that, the Doherty power amplifying circuit with a power distribution ratio of 1:1:1 shown in FIG. 1 is turned on at 12 dB and 6 dB separately, while the Doherty power amplifying circuit with a power distribution ratio of 1:2:2 shown in FIG. 2 is turned on at a different point. Certainly, an impedance matching circuit in a combiner 2 of the Doherty power amplifying circuit with a power distribution ratio of 1:2:2 is also different from the Doherty power amplifying circuit with a power distribution ratio of 1:1:1. A proper impedance transformation relationship is selected according to a relationship between maximum output powers of C3, C4, P3 and P4.

In specific operation, a power distribution ratio of 1:1:1 or 1:2:2 is selected according an actual peak-to-average power ratio of a communications system signal.

When it is extended to a 3-branch Doherty power amplifying circuit with a power distribution ratio of 1:M:M, a maximum output power relationship of the 3-branch Doherty power amplifying circuit with a power distribution ratio of 1:M:M is as follows:

a maximum output power of C1=a maximum output power of C2; and a maximum output power of P1=a maximum output power of P2=2*M*the maximum output power of C1, where M is a positive number, for example, M=1.2, M=1.5, or the like is acceptable.

When it is extended to an N-way Doherty power amplifying circuit with a power distribution ratio of 1:M: . . . :M, a maximum output power relationship of the N-way Doherty power amplifying circuit with a power distribution ratio of 1:M: . . . :M is as follows:

a maximum output power of P1=a maximum output power of P2=a maximum output power of (PN−1)=(N−1) *M*a maximum output power of C1;

the maximum output power of C1=a maximum output power of C2= . . . =a maximum output power of (CN−1), and it is set that gate bias voltages of P1 to (PN−1) sequentially reduce; therefore, P1 to (PN−1) are sequentially turned on.

The foregoing disclosures are merely exemplary embodiments of the present application. However, the protection scope of the present application is not limited thereto. Therefore, equivalent variations made according to the claims of the present application shall fall within the scope of the present application.

What is claimed is:

1. A Doherty power amplifying circuit, wherein the Doherty power amplifying circuit comprises at least two asymmetrical two-branch power devices, and each of the at least two asymmetrical two-branch power devices comprises two power amplifiers; and in the at least two asymmetrical two-branch power devices, one power amplifier comprised in each asymmetrical two-branch power device separately forms a peak power amplifier of the Doherty power amplifying circuit, and the other power amplifiers comprised in all the asymmetrical two-branch power devices jointly form a main power amplifier of the Doherty power amplifying circuit;

wherein in the at least two asymmetrical two-branch power devices, a gate bias voltage of each of the one power amplifiers that separately form a peak power amplifier is lower than a gate bias voltage of each of the other power amplifiers that jointly form the main amplifier of the Doherty power amplifying circuit.

2. The circuit according to claim 1, wherein each of the at least two asymmetrical two-branch power devices is formed by integrating the two power amplifiers comprised in each asymmetrical two-branch power device.

3. The circuit according to claim 1, wherein the peak power amplifiers of the Doherty power amplifying circuit are turned on sequentially in descending order of gate bias voltage.

4. The circuit according to claim 1, wherein the Doherty power amplifying circuit is a N-way Doherty power amplifying circuit, and the Doherty power amplifying circuit comprises N−1 asymmetrical two-branch power devices, wherein N is a positive integer greater than 2.

5. The circuit according to claim 4, wherein in the N−1 asymmetrical two-branch power devices, power amplifiers comprised in all the asymmetrical two-branch power devices and configured to jointly form a main power amplifier of the N-way Doherty power amplifying circuit have an equal first maximum output power; and in the N−1 asymmetrical two-branch power devices, a power amplifier comprised in each asymmetrical two-branch power device and configured to separately form a peak power amplifier of the N-way Doherty power amplifying circuit has an equal second maximum output power;

wherein the second maximum output power=(N−1) *M*the first maximum output power, wherein M is a positive number.

6. The circuit according to claim 4, wherein a value of M increases with a peak-to-average power ratio of a communications system signal.

7. The circuit according to claim 4, wherein each of the N−1 asymmetrical two-branch power devices is formed by integrating the two power amplifiers comprised in each asymmetrical two-branch power device.

8. The circuit according to claim 1, wherein in the at least two asymmetrical two-branch power devices, each of the two power amplifiers comprised in each asymmetrical two-branch power device has a corresponding impedance matching circuit, and the impedance matching circuit comprises an input matching circuit and an output matching circuit.

9. The circuit according to claim 8, wherein each of the two power amplifiers comprised in each asymmetrical two-branch power devices is connected to a combiner by using their respective output matching circuits.

10. The circuit according to claim 9, wherein the combiner comprising an impedance transformation part of the Doherty power amplifying circuit, and a impedance transformation relationship corresponding to the impedance transformation part is selected according to the relationship between the maximum output powers of the power amplifiers in the at least two asymmetrical two-branch power devices.

* * * * *